United States Patent
Doll et al.

(10) Patent No.: US 8,497,215 B2
(45) Date of Patent: Jul. 30, 2013

(54) EDGE DELETION OF THIN-LAYER SOLAR MODULES BY ETCHING

(75) Inventors: Oliver Doll, Heusenstamm (DE); Ingo Koehler, Reinheim (DE)

(73) Assignee: Merck Patent GmbH, Darmstadt (DE)

(*) Notice: Subject to any disclaimer, the term of this patent is extended or adjusted under 35 U.S.C. 154(b) by 79 days.

(21) Appl. No.: 13/061,274

(22) PCT Filed: Aug. 5, 2009

(86) PCT No.: PCT/EP2009/005653
§ 371 (c)(1),
(2), (4) Date: Feb. 28, 2011

(87) PCT Pub. No.: WO2010/022849
PCT Pub. Date: Mar. 4, 2010

(65) Prior Publication Data
US 2011/0159636 A1 Jun. 30, 2011

(30) Foreign Application Priority Data
Sep. 1, 2008 (EP) .................................. 08015378

(51) Int. Cl.
*H01L 21/302* (2006.01)
*H01L 21/461* (2006.01)
*C03C 25/68* (2006.01)
*C09K 13/00* (2006.01)

(52) U.S. Cl.
USPC ........... 438/745; 438/752; 438/753; 438/754; 216/96; 216/99; 216/101; 216/103; 216/108; 252/79.1

(58) Field of Classification Search
None
See application file for complete search history.

(56) References Cited

U.S. PATENT DOCUMENTS

| | | | |
|---|---|---|---|
| 3,598,741 A * | 8/1971 | Kanno | 252/79.3 |
| 4,426,252 A * | 1/1984 | Kape | 216/104 |
| 5,538,600 A * | 7/1996 | Schultz et al. | 428/31 |
| 6,271,053 B1 | 8/2001 | Kondo | |
| 6,384,315 B1 | 5/2002 | Yamagishi et al. | |
| 2005/0167005 A1* | 8/2005 | Barnard et al. | 148/275 |
| 2008/0038932 A1* | 2/2008 | Wagner | 438/753 |
| 2008/0121621 A1 | 5/2008 | Stockum et al. | |
| 2008/0224092 A1* | 9/2008 | Choung et al. | 252/79.3 |
| 2010/0018564 A1 | 1/2010 | Shinohara | |
| 2010/0068889 A1 | 3/2010 | Stockum et al. | |
| 2010/0167085 A1* | 7/2010 | Sun et al. | 428/650 |
| 2010/0319751 A1* | 12/2010 | Day et al. | 136/244 |

FOREIGN PATENT DOCUMENTS

| | | |
|---|---|---|
| DE | 10 2005 007 743 A1 | 7/2006 |
| DE | 10 2006 051 952 A1 | 5/2008 |
| EP | 1 039 554 A1 | 9/2000 |
| EP | 2 068 370 A1 | 6/2009 |

OTHER PUBLICATIONS

International Search Report of PCT/EP2009/005653 (Aug. 11, 2010).

* cited by examiner

*Primary Examiner* — Scott B Geyer
(74) *Attorney, Agent, or Firm* — Millen, White, Zelano & Branigan, P.C.

(57) ABSTRACT

The present invention relates to a method for the wet-chemical edge deletion of solar cells. An etching paste is applied to the edge of a solar cell substrate surface and after the reaction is complete, the paste residue is removed. Optionally, the substrate surface is cleaned and dried. The etching paste comprises 85% $H_3PO_4$, $NH_4HF_2$ and 65% $HNO_3$ in a ratio in the range from 7:1:1.5 to 10:1:3.5, based on the weight.

17 Claims, 1 Drawing Sheet

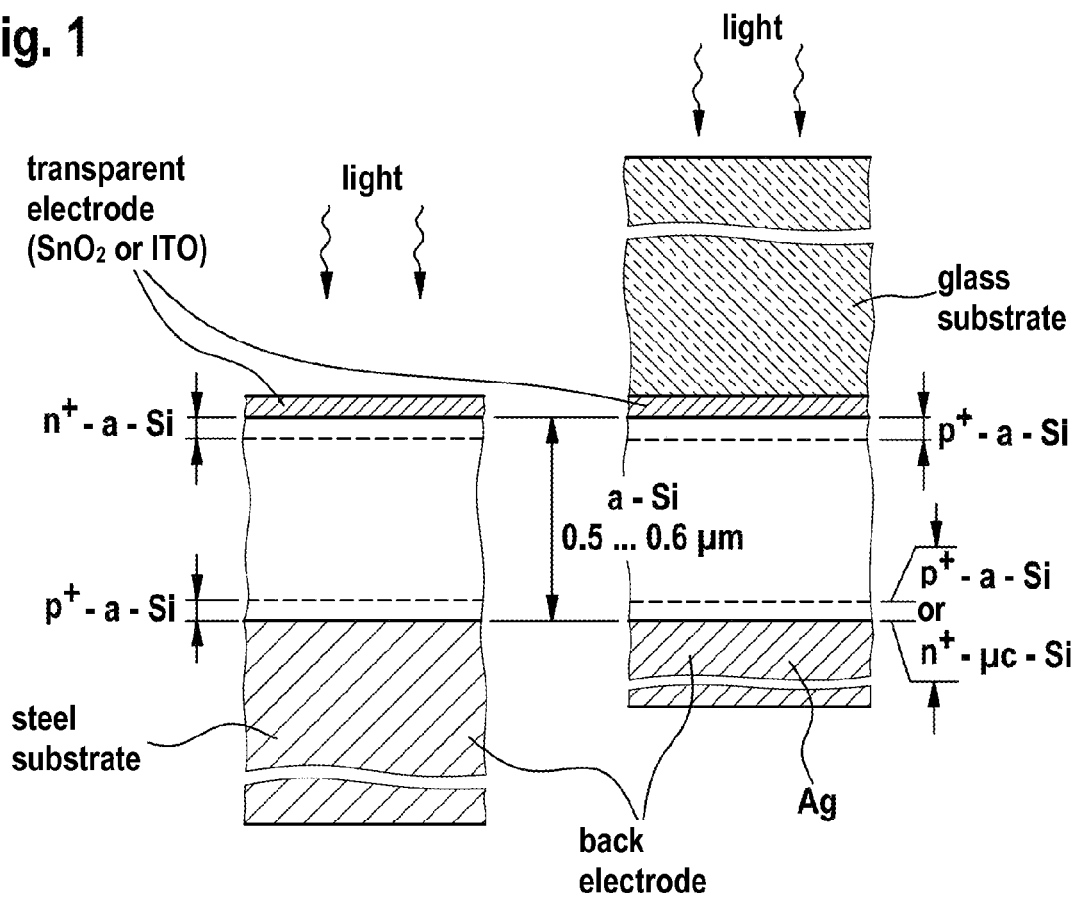
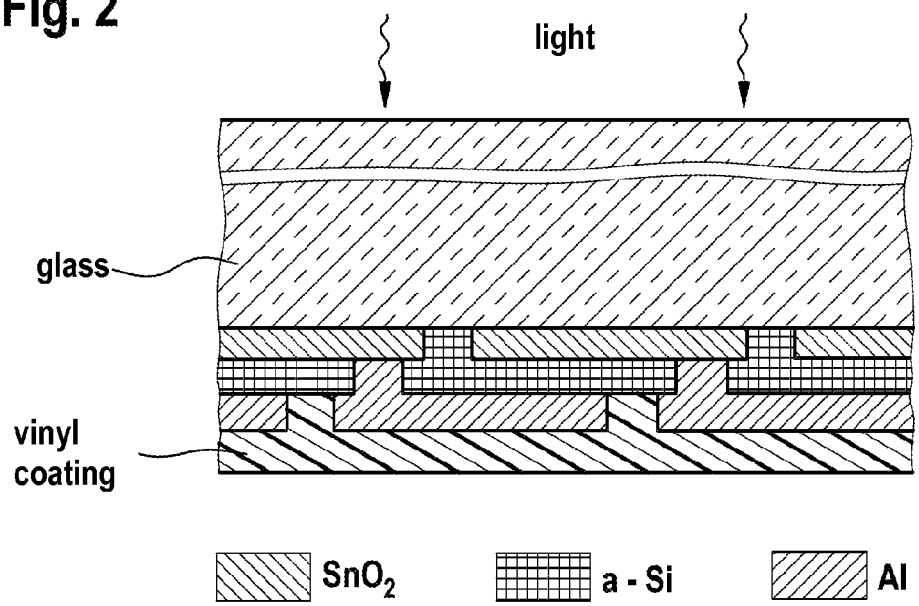

EDGE DELETION OF THIN-LAYER SOLAR MODULES BY ETCHING

The present invention relates to a fast and inexpensive method which can be carried out locally for the wet-chemical edge deletion of solar modules/cells by applying etching pastes which are suitable for this purpose and, when the reaction is complete, removing the paste residues or cleaning the substrate surface in a suitable manner. An etching paste newly developed for the purpose is employed in the method.

The industrial production of thin-layer solar modules/cells is currently carried out on mostly inert (large-area steel sheets form an exception here) large-area support materials, which can be, inter alia, glass sheets, plastic films or sheets and/or steel plates. After and during the full-area deposition of functional thin layers on the inert support materials, which define the later solar module/cell, the functional active layers of the solar modules are advantageously divided into individual solar cells, with the support material remaining on the entire area. In the following context, the term "solar module" is used synonymously for a thin-layer solar module and for an arrangement of a plurality of electrically connected thin-layer solar cells—generally used as a generic term for all photovoltaic components which are generally understood under the term "thin-layer photovoltaics" by the person skilled in the art. A typical "solar module" is constructed from a stack of thin functional layers which, viewed from the substrate, have the following sub-division (see FIG. 1):
a) (transparent) electrode,
b) differently doped and optionally undoped semiconductor layers and finally so-called pin and nip structures,
c) a further electrode.

FIG. 1 shows a corresponding diagrammatic structure of solar modules as described.

FIG. 2 shows a diagrammatic view of an encapsulation of solar modules, as described and depicted by Hans-Günther Wagemann and Heinz Eschrich, in: *Photovoltaik* [Photovoltaics], 1st Edn., 2007, B. G. Teubner Verlag, Wiesbaden, Germany.

Deviations from this structure generally outlined in FIGS. 1 and 2 are possible in each case.

After structuring of the "solar module", it is necessary to seal and encapsulate the surface not delimited by the support material (i.e. the surface which is characterised by the deposition of the thin functional layers) in order thus to protect it against slight mechanical damage and also against chemical-physical erosion as a consequence of weathering influences (cf. FIG. 2). For this purpose, the surface to be sealed is usually covered with an extremely resistant polymer coating, plastic film or a glass sheet of the same size and shape, or a sequence of a plurality of elements just mentioned. The surface sealing is bonded to the support material at the edge of the solar module by means of adhesive bonding with the aid of multicomponent adhesives and/or by means of lamination using a polymer which is suitable for this purpose. For this purpose, the edge of the support material must be freed from the deposited functional layer stack for about one to two centimeters in order to ensure adhesion of the multilayered laminate to the support material and at the same time to protect the "solar module" against chemical-physical influences, which can act on the entire "solar module" via this edge position. In the further context, the term "substrate" is taken to mean the system to which the etching pastes are applied. The removal of the functional layer stack in a one to two centimeter wide edge region of the support material is referred to as "edge deletion" in the text below.

The edge deletion is currently carried out industrially by means of sand blasting, grinding of the edge region using a rotating grinding wheel and/or laser systems.

All methods have the inherent disadvantages of firstly large-area contamination of the entire module surface by particulate impurities, as a consequence of the sand jet and also partial residues of the layer stack remaining behind, and secondly sintering phenomena in the adjacent regions of the removed edge. In addition, laser technology is characterised by high investment costs.

Objective

The object of the present invention is thus to provide a simple and inexpensive method which avoids the disadvantages described above. The present object furthermore consists in providing the compositions necessary for carrying out the method.

Description of the Invention

It has now been found that the present problem can be solved in a simple manner by a method which can be carried out quickly and inexpensively for the wet-chemical edge deletion of "solar modules" by applying etching pastes which are suitable for this purpose and, when the reaction is complete, removing the paste residues or cleaning the substrate surface in a suitable manner. The present invention correspondingly likewise relates to the novel paste which can be employed in the method.

The present invention furthermore relates to an etching paste which can be employed both for the structuring of silicon and metal layers in (micro)electronic, photovoltaic and microelectromechanical (MEMS) components. In this connection, photovoltaic components are in particular and preferably taken to mean thin-layer solar modules/cells and crystalline solar cells in general. In accordance with the invention, these are also taken to mean in this connection thin layers to be structured which have to be treated for the production of such components, preferably of "solar modules".

Mention may be made here by way of example, but not comprehensively, of the following:

rear-contacted crystalline solar cells with and without interdigitising contact structures, MWT, EWT, PERC, PERL and PERT solar cells, solar cells with buried contacts, edge insulation of silicon wafers and solar cells, wafers which are treated by single-sided etching and subsequent polishing, separation and isolation of thin-layer solar cells from thin-layer solar modules, etching of vias in the production of "solar modules" and cells, structuring processes during the production of display, communication and illumination elements based on the technologies of thin-film transistors (TFTs), liquid crystals (LCDs), electroluminescence (EL), organic light-emitting diodes (OLEDs) and contact-sensitive capacitive and resistive sensors.

Surprisingly, it has been possible to develop a pasty etching mixture which is suitable for etching functional layer stacks simultaneously in one step. The adherent paste residues can subsequently be removed from the substrate surface in a simple manner, and the support material of the "solar module" can be cleaned. In this way, it is possible to carry out edge deletion without damaging the functional thin layers in adjacent regions which are directly adjacent to the edge wetted with paste. The paste composition according to the invention is advantageously storage-stable as such, meaning that the etching paste according to the invention can be used by the user without further precautions.

Consequently, the present development relates to a stabilised pasty etching mixture in the form of an etching paste which can be employed for the simultaneous etching of the above-mentioned stack of functional layers and where the layers to be etched can consist of various materials, such as, for example, of doped and undoped silicon and metal layers and derivatives thereof. Corresponding metal layers can consist of Al, Ag, Cu, Ni, Cr, Mo, Ta, Ti, W, Zn, $Ti_xO_y$, $Ti_xW_y$, $Ni_xV_y$, $Ta_xN_y$, $Ti_xN_y$. The layers to be etched can also be oxides or mixed oxides, such as indium tin oxide (ITO), indium zinc oxide (IZO), indium oxide (IO), aluminium zinc oxide (AZO), zinc oxide (ZO) or similar oxides. On the other hand, they may also be doped and undoped semiconductor layers, such as c-Si, a-Si and μ-Si layers, so-called pin or nip layer stacks, or layers of Ge and alloys thereof, or of GaAs and ternary and quaternary mixtures thereof or of III-IV and II-IV semiconductors in general[2].

Whereas it is in each case only possible to etch specific layers selectively using etching pastes which are usually employed in methods for the production of solar cells, it is, surprisingly, possible using the pastes according to the invention to etch both metal layers and also semiconductor layers, which may be doped, but also the above-mentioned oxide and mixed oxide layers in one step. It is therefore possible, in an advantageous manner, using the etching pastes according to the invention to remove edge layers of "solar modules" in one step.

In order to carry out the method, the etching paste is deposited on the edge region of the "solar module" in a manner known to the person skilled in the art, preferably by means of dispensers, for the purposes of edge deletion. In order to accelerate the etching process, activation and heat treatment of the substrate provided with etching paste may optionally be carried out. The increased temperature causes faster initiation of the reaction, but also accelerates the subsequent drying (out) and inhibition of the etching medium. During the heat treatment, a maximum temperature of 150° C. should not be exceeded.

The etching is preferably carried out at a temperature in the range from 30 to 100° C., which may be followed by a further increase in temperature in order to terminate the etching operation and remove any paste residues. In a preferred procedure, the paste residues are removed after the etching step by washing or blowing off and drying out at an elevated temperature in the range from 100 to 145° C. However, the etching may also be followed directly by a washing step in order to remove paste residues.

Furthermore, it is possible, but not necessary, to carry out slight etching and consequently roughening of the support material which mechanically stabilises the "solar module". This may be desirable in order to achieve increased adhesion of the multilayered laminate described in the subsequent production process for the purposes of encapsulation.

The paste residues can be removed from the substrate surface by means of suitable cleaning methods known to the person skilled in the art, such as, for example, by blowing off by means of a jet of compressed air, a pressurised jet of gas, a jet of steam, or a jet of compressed air saturated with water vapour or organic solvents and mixtures thereof or by a pressurised jet of gas, by a jet of solvent vapour, cryogenic aerosol (for example $CO_2$ snow in a jet of $CO_2$), by means of a focused jet of water, organic solvents and mixtures of organic solvents with and without water. All cleaning solutions may comprise additives which are suitable for this purpose, which are mentioned in greater detail below. Furthermore, the substrate surfaces can be cleaned by passing through a cleaning unit, by means of regiospecific brush and sponge cleaning, using water, organic solvents, mixtures thereof, including and excluding water, and optionally comprising further additives, such as, for example, surfactants, mixtures of surfactants, complexing agents and chelating agents, foam inhibitors and functional salts. Subsequent fine rinsing using the above-mentioned rinsing media can subsequently be carried out.

After these cleaning steps, a fully cleaned surface region is obtained. If slight paste impurities should remain on the surface, it has been found that they do not themselves further impair the functioning, application, curing and/or lamination of the "solar module" using the encapsulation materials described above.

The present invention therefore relates to a stabilised pasty etching mixture in the form of an etching paste. This paste is particularly suitable for the etching of silicon and metal layers built up in the form of a stack and is therefore very particularly suitable for the edge deletion of "solar modules".

These etching pastes according to the invention may have the following ingredients:
water, and optionally
organic solvents and solvent mixtures,
inorganic and organic oxidants,
inorganic and organic acids,
polymeric inorganic and organic thickeners,
gelling agents, network formers and fillers,
thixotropic agents and rheology modifiers,
optionally complexing agents and chelating agents,
and masking agents,
optionally surface-active substances, and flow assistants and surfactants,
optionally deaerators and antifoams.

The organic solvents are preferably DMSO, NMP and the like. These solvents can be employed alone and as mixtures.

As mentioned above, the etching pastes according to the invention may comprise oxidants. $HNO_3$, $H_2O_2$, $NaO_2$, $KO_2$, $Na_2S_2O_8$, $(NH_4)_2S_2O_8$, $K_2S_2O_8$, $K_5H_3S_4O_{18}$ and inorganic peroxo compounds, such as $NaBO_2.H_2O_2$ and $[2Na_2CO_3.3H_2O_2]$, $HClO_3$, $NaClO_3$, $KClO_3$, $HBrO_3$, $NaBrO_3$, $KBrO_3$, $HIO_3$, $NaIO_3$, $KIO_3$, $KHIO_6$, $Cr_2O_3$, $NaCr_2O_7$, $K_2Cr_2O_7$, $KMnO_4$, $NaNO_3$, $KNO_3$, $NH_4NO_3$, $NaClO_4$, $HClO_4$, selenates ($SeO_4^{2-}$), $CH_3CO_3H$, and organic peroxo compounds, $Ce(NO_3)_4$, $Ce(SO_4)_2$, $(NH_4)_2Ce(NO_3)_6$ and the like, and mixtures thereof, are preferably employed.

Inorganic and organic acids which may be present in the pastes according to the invention are preferably acids selected from the group $HNO_3$, $H_3PO_4$, $H_2SO_4$, $H_2SiF_6$, $HBF_4$, $H_2PF_6$, $H_2PO_3F$, $H_2PO_2F_2$, HF, $NH_4H_2F$, HCOOH, $CH_3COOH$ and $C_2H_5COOH$, and mixtures thereof. However, acids with the same action may also be present.

In addition, complexing agents and chelating agents may be present in the pastes as additives. Preference is given to the use of chelating agents selected from the group $H_3PO_4$, HF, $NH_4F$, $NH_4HF_2$, $H_2SiF_6$, $HBF_4$, $H_2PO_3F$, $H_2PO_2F_2$ and Titriplex I-VIII. However, phosphonic acid-derivatised homologues thereof (Dequest®, Briquest®) and the like may also be suitable. These complexing agents and chelating agents can be added to the paste individually or as mixtures. Particular preference is given to the use of $H_3PO_4$, $NH_4F$, $NH_4HF_2$ and similar compounds, and mixtures thereof.

The preferred complexing agents and chelating agents are particularly preferably employed with oxidants selected from the group $HNO_3$, $H_2O_2$, $NaO_2$, $KO_2$, $Na_2S_2O_8$, $(NH_4)_2S_2O_8$, $K_2S_2O_8$, $K_5H_3S_4O_{18}$ in the compositions according to the invention. From the group of the oxidants, very particular preference is in turn given to $HNO_3$ and $H_2O_2$.

Compositions which comprise $H_3PO_4$, $NH_4HF_2$ and $HNO_3$ in combination with further additives, such as thickeners, crosslinking agents, surfactants and other additives, have proven particularly effective and particularly stable. Compositions in which $H_3PO_4$, $NH_4HF_2$ and $HNO_3$ are present in a mixing ratio in the range from 7:1:1.5 to 10:1:3.5, based on the weight, and where the weight in each case relates to 85% $H_3PO_4$ and 65% $HNO_3$ have in turn proven particularly advantageous here. Particularly good etching results with simultaneous stability of the composition have been obtained with compositions in which $H_3PO_4$, $NH_4HF_2$ and $HNO_3$ are present in a mixing ratio in the range from 7.5:1:1.8 to 9:1:3, based on the weight.

Compositions which additionally comprise thickeners, in particular polyvinylpyrrolidone, polyvinyl acetate and polyolefin granules, have proven particularly stable. Compositions which comprise $H_3PO_4$, $NH_4HF_2$ and $HNO_3$ in the above-mentioned weight ratio and polyvinylpyrrolidone, polyolefin granules and amino-functionalised polyacrylic acid in a suitable amount have proven very particularly suitable.

Furthermore, surface-active substances may be present. These are preferably selected from the group of anionic, cationic, nonionic and amphoteric surfactants. These surface-active substances may be present individually or in a mixture.

Particular preference is given to surfactants, such as, for example, sodium dodecylsulfate and fatty alcohol ethoxylates, such as polyoxyethylene lauryl ether, and mixtures thereof.

Octanol, polydimethylsilane and similar substances with the same action, and mixtures thereof, may preferably be present as deaerators and antifoams.

In order to achieve the pasty consistency of the compositions according to the invention, polymeric inorganic and organic thickeners, gelling agents and network formers, such as polyacrylic acids, polyacrylates, polyacrylamides, cellulose ethers, such as, for example, methylcellulose, hydroxyethylcellulose (HEC), hydroxypropylcellulose and carboxymethylcellulose, polyvinylpyrrolidone (PVP), polyvinyl acetate, starch, (hetero)polysaccharides, such as pectin, xanthan, carubin, Rhoximat, gum arabic, xanthan gum, agarose and agar, and gelatine and bentonite are added. For edge deletion, etching pastes can be used in which the corresponding thickeners are present individually or as mixtures.

Polymeric inorganic and organic fillers which can be used in the pastes are modified and unmodified highly disperse and pyrogenic silica gels, flame black and graphite, plastic waxes and granules, glass beads and glass splinters, zeolites, aluminium silicate, bentonite and the like, and mixtures thereof.

Simple embodiments of the etching pastes according to the invention preferably consist of a mixture consisting of solvents, an oxidant, an inorganic acid, a complexing agent or chelating agent, and thickeners and fillers, but where not all the above-mentioned components must be present.

As described above, the etching pastes of this composition are suitable for etching stacks of functional thin layers in one step, where the layer stack may have the following structure: support material/lower electrode/differently doped and undoped semiconductor layers/upper electrode.

These pastes are, if desired, simultaneously also suitable for the incipient etching and roughening of the support material. In particular cases, the support material may correspond to the lower electrode. At the same time, the upper electrode may be the same as the lower electrode in a particular embodiment of the "solar module" to be treated.

The lower electrode may in turn be transparent and preferably consist of indium tin oxide (ITO), indium zinc oxide (IZO), indium oxide (IO), aluminium zinc oxide (AZO), zinc oxide (ZO) or similar oxides, while the upper electrode can preferably consist of Al, Ag, Cu, Ni, Cr, Mo, Ta, Ti, V, W and alloys of the said elements, with further alloy constituents, some of which are not specified in greater detail here, double and triple metal layers, where one layer in turn comprises at least one metal from the group mentioned and alloys thereof, and finally oxidic and mixed oxidic conductive materials, as mentioned above.

The doped and undoped semiconductor layers of the layer structure of a "solar module" preferably consist of doped and undoped a-Si and μ-Si (p-i-n and n-i-p), but are not necessarily restricted to the two materials mentioned and may also comprise doped and undoped layers of crystalline silicon. Corresponding layers may additionally consist of Ge and alloys thereof, GaAs and ternary and quaternary mixtures thereof or of III-IV and II-IV semiconductors in general.

The etching pastes according to the invention are advantageously suitable for removing all these layers cleanly at the edge of a "solar module" in a single step as far as the support layer, without leaving interfering contamination behind on the remaining effective surface of the "solar module".

In order to carry out the etching method, the pastes according to the invention, which are formulated on the basis of the above-mentioned ingredients of the pastes, can be applied to and deposited on the substrate to be etched by means of screen printing, stencil printing, dispensing, dispense jetting or by means of similar application methods.

The pastes according to the invention enable edges of "solar modules" to be deleted in a simple manner. Paste residues remaining behind after the etching step carried out for the edge deletion can be removed from the surface in a simple manner by means of a suitable cleaning method, such as, for example, by blowing off by means of a jet of compressed air, a pressurised jet of gas, a jet of steam, a jet of compressed air or pressurised gas saturated with water vapour or with organic solvents or mixtures thereof, a jet of solvent vapour, cryogenic aerosol (for example $CO_2$ snow in a jet of $CO_2$ gas), a focused jet of water, organic solvents and mixtures of organic solvents with and without water, all comprising additives specified in greater detail below, and furthermore by passing through a cleaning unit, by means of regiospecific brush and sponge cleaning, using water, organic solvents, mixtures thereof, including and excluding water, and comprising further additives, such as, for example, surfactants, mixtures of surfactants, complexing agents and chelating agents, foam inhibitors, functional salts, and subsequent fine rinsing using the above-mentioned rinsing media.

It has furthermore been found that the etching pastes which can be employed in accordance with the present invention for edge deletion are also suitable for the structuring of the above-described doped or undoped, trans-parent oxidic layers or of metal layers in the form of layers and layer stacks for the purposes of structuring of (micro)electronic, microelectromechanical and photovoltaic components.

The etching pastes according to the invention are preferably suitable for the structuring of rear-contacted crystalline solar cells with and without interdigitising contact structures, of solar cells with buried contacts, MWT, EWT, PERC, PERL and PERT solar cells, of wafer edges and for the edge insulation of crystalline solar cells, for the single-sided etching and polishing of silicon wafers, for the separation and isolation of thin-layer solar cells from thin-layer solar modules, for the etching of vias in the production of thin-layer solar modules and cells, structuring processes during the production of display, communication and illumination elements based on the technologies of thin-film transistors (TFTs), liquid crystals (LCDs), electroluminescence (EL), organic light-emitting diodes (OLEDs) and contact-sensitive capacitive and resistive sensors.

Literature:
[1] Hans-Günther Wagemann, Heinz Eschrich, *Photovoltaik* [Photovoltaics], 1st Edn., 2007, B. G. Teubner Verlag, Wiesbaden, Germany
[2] A. F. Bogenschütz, *Ätzpraxis für Halbleiter* [Etching Practice for Semiconductors], 1st Edn., 1967, Carl-Hanser-Verlag, München, Germany.

EXAMPLES

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

The temperatures given in the examples are always indicated in ° C. It furthermore goes without saying that, both in the description and also in the examples, the added amounts of the components in the compositions always add up to a total of 100%.

Example 1

A paste is prepared from 50.2 g of $HNO_3$ (33%), 10.6 g of $NH_4HF$, 4 g of xanthan gum and 10.6 g of isopropanol by mixing the constituents successively with one another by vigorous stirring.

The paste is applied to a "solar module" made from glass/AZO/aSi/Al. The layer stack is etched for 3 minutes at 100° C. on a hotplate. After the paste has been dried at 120° C., the paste residues are blown off over the course of 2 minutes by means of a focused jet of compressed air. The subsequent measurement of the conductivity between two points in the etched structures gives a resistance >30 Mohm.

Example 2

A paste is prepared from 170 g of $H_3PO_4$ (85%), 20 ml of water, 10 ml of $HNO_3$ (65%), 20 g of polyvinylpyrrolidone, 3 g of hydroxyethylcellulose, 2.3 g of polyoxyethylene lauryl ether, 3 g of polyoxyethylene stearyl ether and 5.2 g of flame black by mixing the constituents successively with one another by vigorous stirring.

Subsequently,
a) the paste is applied to an aluminium layer on glass and etched for 2 minutes at 60° C. and
b) the paste is applied to an Mo/Al double layer on glass and etched at for 10 minutes 60° C.

The paste residues are subsequently rinsed off by means of a jet of water. In both cases, structuring of the metal layers takes place. The subsequent measurement of the conductivity between two points in the etched structures gives a resistance >30 Mohm.

Example 3

A paste is prepared from 170 g of $H_3PO_4$ (85%), 20 g of $NH_4HF_2$, 20 ml of water, 10 ml of $HNO_3$ (65%), 20 g of polyvinylpyrrolidone, 3 g of hydroxyethylcellulose, 2.3 g of polyoxyethylene lauryl ether or 3 g of polyoxyethylene stearyl ether and 5.2 g of flame black by mixing the constituents successively with one another by vigorous stirring.

Subsequently,
a) the paste is applied to aluminium layers on glass and etching is carried out for 2 minutes at 60° C. and
b) the paste is applied to an Mo/Al double layer on glass and etching is carried out at 60° C. for 10 minutes.

When the etching is complete, the paste residues are rinsed off by means of a jet of water. In both cases, structuring of the metal layers takes place. The subsequent measurement of the conductivity between two points in the etched structures gives a resistance >30 Mohm.

Example 4

A paste is prepared from 50 g of $H_3PO_4$ (85%), 6 g of $NH_4HF_2$, 10 ml of $HNO_3$ (65%), 5 g of polyvinylpyrrolidone, 1 g of polyoxyethylene lauryl ether, 1 g of polyoxyethylene stearyl ether and 5 g of polyolefin granules by mixing the constituents successively with one another by vigorous stirring.

The paste is applied to a "solar module" made from glass/AZO/aSi/Al, and etching of the layer stack is carried out for 5 minutes at 50° C. on a hotplate. After the paste has been dried for 2 minutes at 120° C., the paste residues are blown off by means of a focused jet of compressed air. The subsequent measurement of the conductivity between two points in the etched structures gives a resistance >30 Mohm.

Example 5

A paste is prepared from 50 g of $H_3PO_4$ (85%), 6 g of $NH_4HF_2$, 10 ml of $HNO_3$ (65%), 5 g of polyvinylpyrrolidone and 5 g of polyolefin granules by mixing the constituents successively with one another by vigorous stirring.

The paste is applied to a "solar module" made from glass/AZO/aSi/Al. The "solar module" treated in this way is warmed for 5 minutes at a temperature of 50° C. on a hotplate, and etching of the layer stack is carried out. After the paste has been dried at 120° C. for 2 minutes, the paste residues are blown off by means of a focused jet of compressed air.

The subsequent measurement of the conductivity between two points in the etched structures gives a resistance >30 Mohm.

Example 6

A paste is prepared from 50 g of 85% $H_3PO_4$, 6 g of $NH_4HF_2$, 10 ml of 65% $HNO_3$, 3 g of polyvinylpyrrolidone, 3 g of amino-functionalised polyacrylic acid and 6 g of polyolefin granules by mixing the constituents successively with one another by vigorous stirring.

The paste is applied to a "solar module" made from glass/AZO/aSi/Al. The "solar module" treated in this way is warmed for 5 minutes at a temperature of 50° C. on a hotplate, and etching of the layer stack is carried out. After the paste has been dried at 120° C. for 2 minutes, the paste residues are blown off by means of a focused jet of compressed air.

The subsequent measurement of the conductivity between two points in the etched structures gives a resistance >30 Mohm.

The invention claimed is:
1. A method for the wet-chemical edge deletion of solar cells, comprising:
applying an etching paste to the edge of a solar cell substrate surface, and,
after the reaction is complete, removing the paste residues, and, optionally cleaning and drying the substrate surface
wherein said etching paste comprises 85% $H_3PO_4$, $NH_4HF_2$ and 65% $HNO_3$ in a ratio in the range from 7:1:1.5 to 10:1:3.5, based on the weight.

2. A method according to claim 1, wherein said etching paste is applied to the edge of the substrate surface in a width of about one to two centimeters.

3. A method according to claim 1, wherein said substrate surface comprises doped and undoped semiconductor layers which are etched in one etching step.

4. A method according to claim 3, wherein said doped or undoped semiconductor layer is a crystalline silicon, a-Si, μ-Si (p-i-n and n-i-p) layer, Ge, a Ge alloy, GaAs or a ternary or a quaternary mixture thereof, a III-IV and II-IV semiconductor, a metal, a metal alloy, an oxide or a mixed oxide.

5. A method according to claim 3, wherein said metal or metal alloy is Al, Ag, Cu, Ni, Cr, Mo, Ta, Ti, V, W, Zn, $Ti_xW_y$, $Ni_xV_y$, $Ta_xN_y$ or $Ti_xN_y$.

6. A method according to claim 3, wherein said oxide or mixed oxide is a indium tin oxide (ITO), a indium zinc oxide (IZO), a indium oxide (IO), an aluminium zinc oxide (AZO) or a zinc oxide (ZO).

7. A method according to claim 1, wherein said etching is carried out at a temperature in the range from 30 to 100° C.

8. A method according to claim 1, wherein said paste residues are removed after the etching step by washing or blowing off and drying out at an elevated temperature in the range from 100 to 150° C.

9. An etching paste composition comprising 85% $H_3PO_4$, $NH_4HF_2$ and 65% $HNO_3$ in a ratio in the range from 7:1:1.5 to 10:1:3.5, based on the weight.

10. A composition according to claim 9, comprising 85% $H_3PO_4$, $NH_4HF_2$ and 65% $HNO_3$ in a ratio in the range from 7.5:1:1.8 to 9:1:3, based on the weight.

11. A composition according to claim 9, comprising polyvinylpyrrolidone and polyolefin granules as thickener.

12. A composition according to claim 9, comprising polyvinylpyrrolidone, polyolefin granules and amino-functionalised polyacrylic acid.

13. A method for the edge deletion of solar modules which comprises applying a paste composition according to claim 9 to said solar module.

14. A method for the etching of doped and undoped semiconductor layers which comprises applying a paste composition according to claim 9, to doped and undoped semiconductor layers.

15. A method according to claim 14, wherein said doped or undoped semiconductor layer is a crystalline silicon, a-Si, μ-Si (p-i-n and n-i-p) layers, Ge, a Ge alloy, GaAs or a ternary or a quaternary mixture thereof, a III-IV and II-IV semiconductor, a metal, a metal alloy, an oxide or a mixed oxide.

16. A method according to claim 14, wherein said metal or metal alloy is Al, Ag, Cu, Ni, Cr, Mo, Ta, Ti, V, W, Zn, $Ti_xW_y$, $Ni_xV_y$, $Ta_xN_y$ or $Ti_xN_y$.

17. A method according to claim 14, wherein said oxide or mixed oxide is a indium tin oxide (ITO), a indium zinc oxide (IZO), a indium oxide (IO), an aluminium zinc oxide (AZO) or a zinc oxide (ZO).

* * * * *